(12) United States Patent
Nihei et al.

(10) Patent No.: US 6,455,361 B1
(45) Date of Patent: Sep. 24, 2002

(54) SEMICONDUCTOR DEVICE AND MANUFACTURING METHOD OF THE SAME

(75) Inventors: Mizuhisa Nihei; Yuu Watanabe, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/635,918

(22) Filed: Aug. 10, 2000

(30) Foreign Application Priority Data

Oct. 5, 1999 (JP) ............................................. 11-284744

(51) Int. Cl.[7] .............................................. H01L 21/338

(52) U.S. Cl. ...................... 438/172; 438/184; 438/581; 438/583

(58) Field of Search ................................ 438/167, 169, 438/172, 179, 180, 184, 305, 535, 572, 602, 604, 605, 606, 655, 574, 581, 582, 578, 583; 257/194, 412, 413, 388

(56) References Cited

U.S. PATENT DOCUMENTS 5,217,923 A * 6/1993 Suguro ....................... 438/305

* cited by examiner

Primary Examiner—Olik Chaudhuri
Assistant Examiner—Theresa T. Doan
(74) Attorney, Agent, or Firm—Armstrong, Westerman & Hattori, LLP

(57) ABSTRACT

A gate electrode rectangular in section is formed by patterning on a GaAs substrate as a compound substrate having a channel layer. Subsequently, a specific metal, e.g., Ti is deposited. A solid-phase reaction layer to serve as source/drain is formed in a self-alignment manner with the gate electrode by a thermal treatment. The part of the Ti film which has not been reacted is then removed. Thus the source/drain (or at least one of them) are very easily formed to a shallow junction depth without using any ion implantation process. Realized is a semiconductor device showing an excellent device characteristics, capable of suppressing occurrence of short-channel effect even in its shortened gate length for reducing the device size.

7 Claims, 19 Drawing Sheets

SEMICONDUCTOR DEVICE AND MANUFACTURING METHOD OF THE SAME

BACKGROUND OF THE INVENTION

1. Field of the Invention

The present invention relates to semiconductor devices and manufacturing methods of the same, particularly to those suitably applied to metal semiconductor field-effect transistors (hereinafter referred to as MESFETs) and high electron mobility transistors (hereinafter referred to as HEMTS) using compound semiconductors.

2. Description of the Related Art

MESFETs and HEMTs, which are semiconductor devices using compound semiconductors such as GaAs and InP, are used as amplifying devices for high frequency bands, or devices for making up ultra high-speed integrated circuits. At present, in order to obtain higher-speed operation of such devices, shortening of gate length is being developed. Such shortening of gate length requires reduction in source resistance and control of short channel effect.

For example, in a GaAs-base MESFET, as shown in FIG. 19, an ion implantation method is used for forming conductive layers which are to serve as source/drain regions. In addition to the ion implantation for the source/drain regions 101 and 102, shallow implantation regions 104 and 105 are formed in the vicinity of the gate electrode 103 in a self-alignment manner with the gate electrode 103, in order to reduce the source resistance.

In such a GaAs-base MESFET as shown in FIG. 19, formation of a low-resistance layer requires a high-temperature treatment at a temperature in the extent of 700° C. to 800° C. for annealing to activate carriers after ion implantation. This causes the problem that gate characteristics of the gate electrode 103 in relation to the GaAs substrate 111 may deteriorate due to a thermal diffusion. Besides, because the conductive layer thus formed by ion implantation is not sufficiently shallow, also the problem that a short channel effect appears in a shortened gate length to degrade device characteristics, cannot be neglected.

SUMMARY OF THE INVENTION

It is an object of the present invention to provide semiconductor devices using compound semiconductors, including source and drain regions (at least one of them) easily formed with a shallow junction depth without using any ion implantation, wherein occurrence of short channel effect is prevented even in their reduced device size as a result of their shortened gate electrodes, so as to obtain excellent device characteristics.

It is another object of the present invention to provide manufacturing methods of such semiconductor devices.

A semiconductor device according to the present invention comprises a gate electrode on a compound semiconductor substrate and source/drain regions in the compound semiconductor substrate. In particular, the semiconductor device has a MESFET or HEMT structure. In this semiconductor device, at least one of the source/drain regions is made of a solid-phase reaction layer of the compound semiconductor and a specific metal, and electrodes electrically connected to the source/drain regions are provided independently of the solid-phase reaction layer.

In this case, the specific metal is preferably one selected among Ti, Co, Ni, Pd and Mo.

A manufacturing method according to the present invention is for such a semiconductor device. More specifically, the method comprises the steps of: forming a gate electrode by patterning on a channel layer formed on a compound semiconductor substrate; forming a specific metal film so as to cover at least one of side portions. of the gate electrode on the compound semiconductor substrate; reacting the compound semiconductor with the specific metal in solid phase to form at least one solid-phase reaction layer in the compound semiconductor substrate; and removing the part of the specific metal film which has not been reacted, so that at least one of the source/drain regions is made of the solid-phase reaction layer.

In this case, the specific metal film is; preferably formed so as to cover the upper and side portions of said gate electrode, so that the solid-phase reaction layer is formed in a self-alignment manner with the gate electrode.

The depth of the solid-phase reaction layer can be locationally controlled by a locational control of the depth of the specific metal film.

The part of said film which has not been reacted can be removed by etching, such that the gate length of the gate electrode is shortened in the etching process.

The specific metal film can be formed so as to have its thickness at a portion near the gate electrode larger than its thickness on the periphery of the portion.

According to an aspect of the present invention, either side of the gate electrode is covered with an insulating material, and the specific metal film is formed in this state.

According to the present invention, formation of a conductive layer to serve as a source or drain is performed by reacting a compound semiconductor with a specific metal in solid phase, without using any ion implantation method. In this case, since a temperature lower than that for an annealing treatment after the ion-implantation suffices for the thermal treatment for the solid-phase reaction, excessive thermal diffusion of carriers in the solid-phase reaction layer can be controlled, and hence a very shallow junction can be formed. This junction depth can be regulated with a high precision by adjusting the thickness of the specific metal film, and the source and/or the drain can be formed to a desired junction depth with a high precision in coping with a shortened gate electrode.

According to the present invention, therefore, semiconductor devices using compound semiconductors can be realized in which their sources and drains (or at least one of them) can be very easily formed to a shallow junction depth without using any ion implantation process, and,occurrence of short-channel effect can be suppressed even in their reduced device size as a result of their shortened gate electrodes, thus achieving excellent device characteristics.

DETAILED DESCRIPTION OF THE PREFERRED EMBODIMENTS

Hereinafter, preferred embodiments to which the present invention is applied will be described with reference to the accompanying drawings. For the sake of convenience, in these embodiments, the structures of semiconductor devices using compound semiconductors will be described along with their manufacturing methods.

(First Embodiment)

In the description of this embodiment, a GaAs-base MESFET is exemplified as a semiconductor device, and a fundamental feature of this embodiment will be described first along its principal manufacturing steps.

Figure 1A:
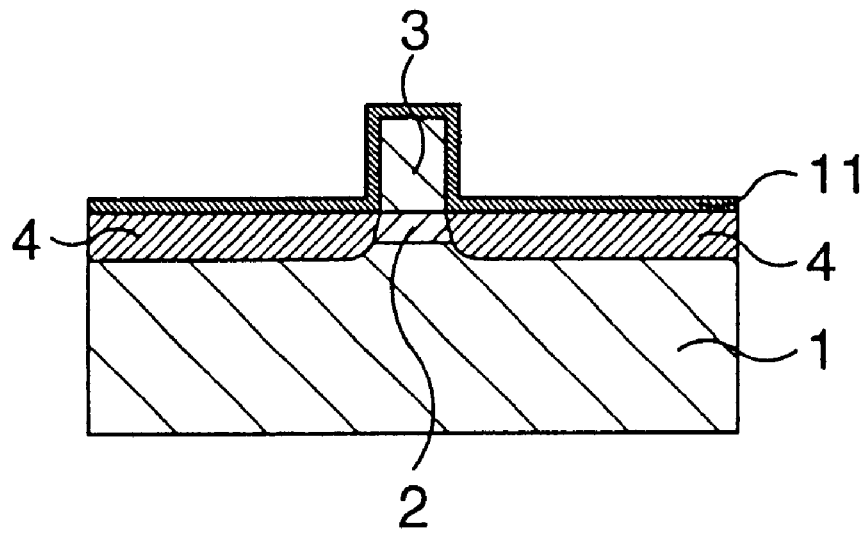
FIGS. 1A and 1B are sectional views of a principal part of a MESFET in principal manufacturing steps for explaining the present invention.
Figure 1B:
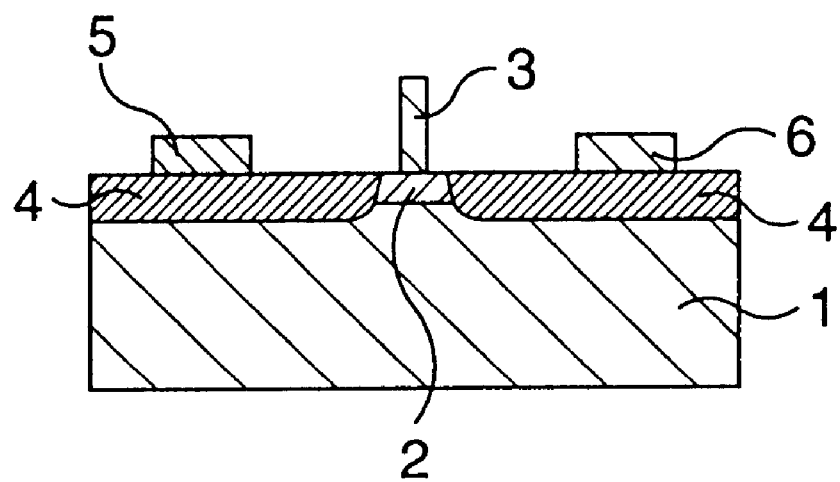

FIGS. 1A and 1B are sectional views of a principal part of the MESFET in the principal manufacturing steps.

A gate electrode 3 rectangular in cross section is formed on a GaAs substrate 1 by patterning. The GaAs substrate 1 is made of a compound semiconductor, and includes a channel layer 2. Subsequently, a specific metal film (e.g., a Ti film 11) is formed by deposition. Solid-phase reaction layers 4 which are to serve as source/drain regions, are then formed in a self-alignment manner with the gate electrode 3 by a thermal treatment (FIG. 1A). Next, portions of the Ti film 11 which did not react in the thermal treatment, are removed by etching. At this time, if etching is performed under conditions that also the gate electrode material is partially etched off, the gate length can be shortened. After this, using a known deposition method and a known lift-off method, electrodes 5 and 6 (source and drain electrodes 5 and 6) are formed to be electrically connected to the respective solid-phase reaction layers 4 (FIG. 1B).

When the metal is titanium (Ti) and the compound semiconductor is gallium arsenide (GaAs), the Ti film 11 needs to have a thickness of 4 nm or more. Accordingly, in consideration of surely performing such a solid-phase reaction, the thermal treatment temperature used is preferably limited within the range of 350 to 650° C. This temperature range is much lower in comparison with the temperature range of 700 to 800° C. that is suitably used for an annealing treatment attendant upon an ion-implantation method. Furthermore, an insulating film of a thickness of 20 nm or more must be formed on the Ti film 11 prior to the thermal treatment, or the thermal treatment must be conducted at a high vacuum of $10^{-5}$ Torr or less. Note that one selected among Co, Ni, Pd and Mo may be employed as the foregoing metal instead of Ti.

Figure 2:
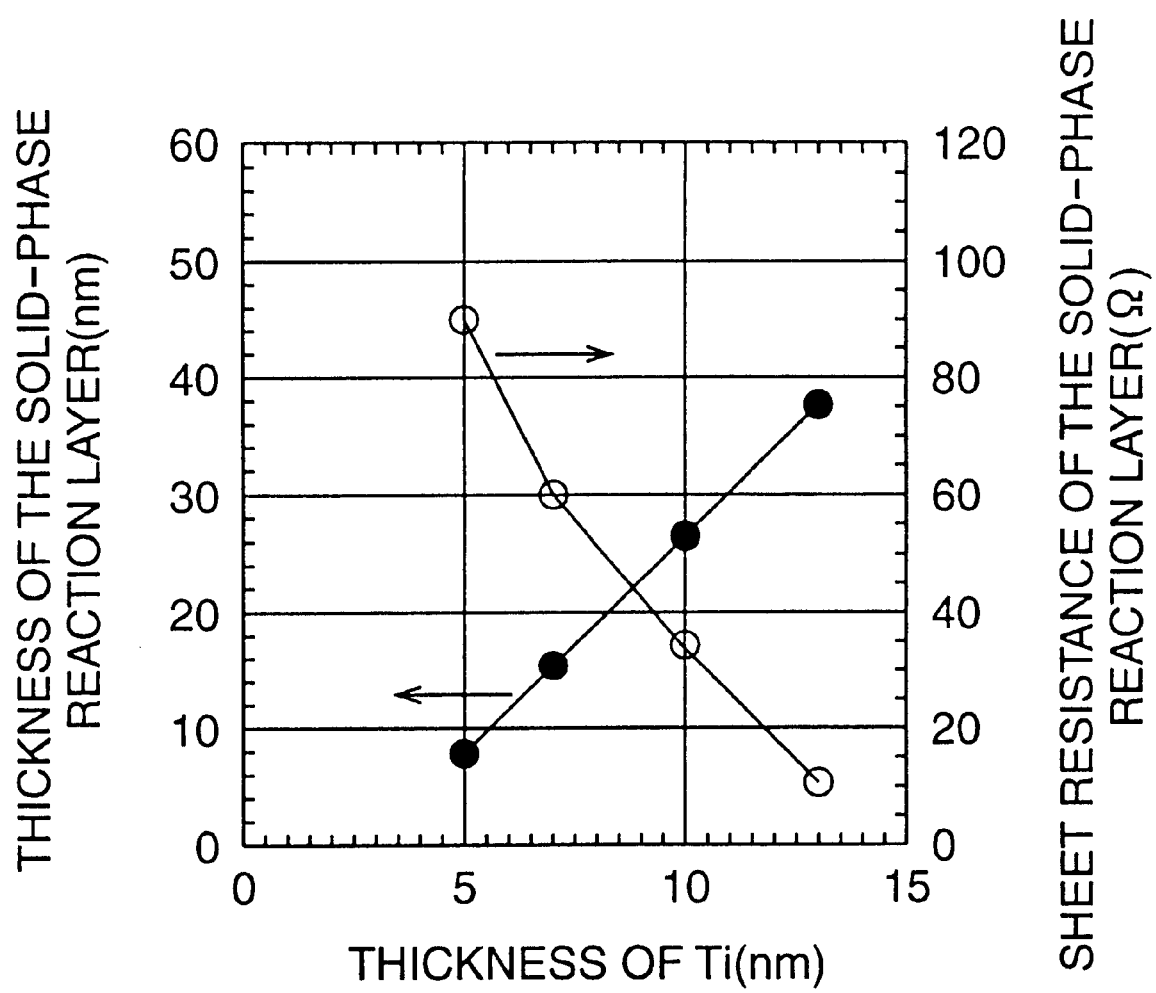
FIG. 2 is a graph showing relations between the thickness of a Ti film and the thickness of a solid-phase reaction layer and between the thickness of the Ti film and the sheet resistance of the solid-phase reaction layer.

Because the thickness of the solid-phase reaction layer 4 depends on the thickness of the Ti film 11, the thickness of the solid-phase layer 4 is controllable by adjusting the thickness of the Ti film 11. As shown in FIG. 2, the thickness of the solid-phase reaction layer 4 increases in proportion to the thickness of the Ti film 11, and the sheet resistance of the solid-phase reaction layer 4 decreases in reverse proportion to the thickness of the Ti film 11. Thus, by forming the source/drain by means of the solid-phase reaction, it is possible to realize the source/drain having a shallow junction depth within the range of about 10 to 30 nm, which has been formed by means of the ion-implantation method with high difficulty.

The formation of the source/drain by means of the foregoing solid-phase reaction makes lower the treatment temperature in performing the solid-phase temperature in comparison with the temperature of the annealing treatment performed after the ion-implantation method, and hence a high performance transistor free from deterioration due to thermal diffusion of impurities from the gate electrode can be manufactured. Moreover, because the solid-phase reaction layer 4 serving as the source/drain can be formed so that its depth is shallow controllably, it is possible to suppress a short channel effect when the gate length is shortened.

Premised on the foregoing fact, the first embodiment of the present invention will be described below.

FIGS. 3A to 3D and FIGS. 4A to 4D are sectional views of a principal portion of a MESFET according to the first embodiment of the present invention, in the order of its manufacturing steps.

Figure 3A:
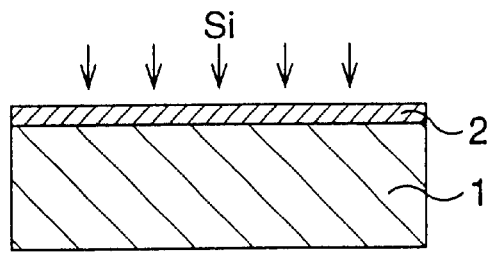
FIGS. 3A to 3D are sectional views showing a manufacturing method of a MESFET, in the order of manufacturing steps, according to the first embodiment of the present invention.

As shown in FIG. 3A, a GaAs substrate 1 is prepared as a compound substrate, and Si ions are ion-implanted into the GaAs substrate 1 by means of an ion-implantation method. The ion-implantation is conducted under the conditions that the acceleration energy is 40 keV and the dose is $4 \times 10^{12}/\text{cm}^2$. Thereafter, a channel layer (n-layer) 2 is formed on the GaAs substrate 1 by performing an activation annealing treatment at a temperature within the range of 700 to 850° C.

Figure 3B:
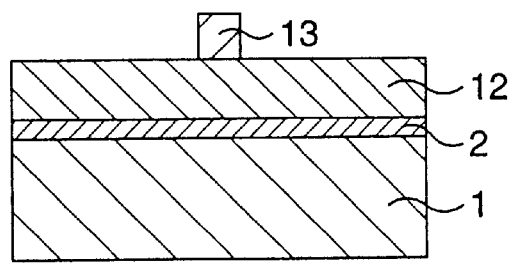

Subsequently, using WSi as a gate electrode material, a WSi film 12 is deposited to a thickness of about 400 nm on the channel layer 2 by means of a sputtering method, as shown in FIG. 3B. Here, a metal such as Al and TiWN may be used as the gate electrode material instead of WSi (the same can apply to all the embodiments described later). A photoresist 13 is then applied on the WSi film 12, and is left at the portion where a gate electrode is to be formed, by photolithography.

Figure 3C:
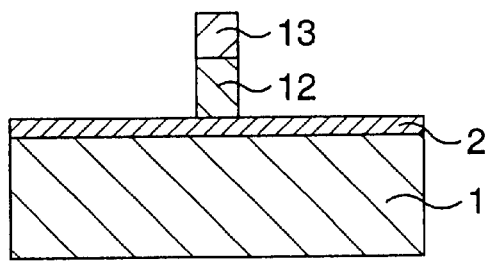

Next, by adopting a dry-etching method using $SF_6$ gas, the portion of the WSi film 12 other than the portion where the gate electrode is to be formed, is removed using the photoresist 13 as a mask, as shown in FIG. 3C.

Figure 3D:
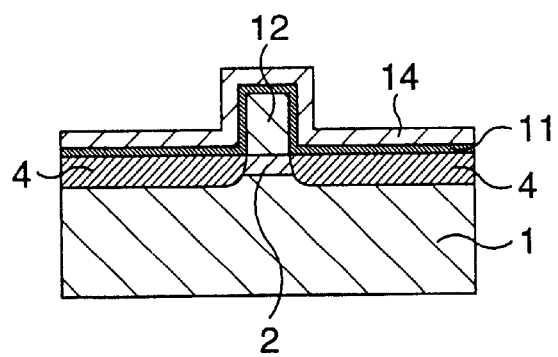

Subsequently, the photoresist 13 that was used as the mask is removed by means of an ashing treatment and the like. Thereafter, as shown in FIG. 3D, using Ti as a metal material used for the solid-phase reaction, a Ti film 11 having a thickness of about 10 nm is deposited on the entire surface of the resultant structure by means of a deposition method. In other words, the Ti film 11 is formed so as to cover the channel layer 2 and the WSi film 12. Here, a metal such as Co, Ni, Pd and Mo, other than Ti, may be employed as the foregoing metal as long as it reacts with a compound semiconductor to form a low resistance layer (the same can apply to all the embodiments described later). As a cap layer used for the solid-phase reaction which requires a thermal treatment, for example, a SiN insulating film 14 is then deposited to a thickness of about 20 nm on the Ti film 11 by means of a plasma CVD method. A nitride film is mainly used as the cap layer. Thereafter, a thermal treatment bringing about the solid-phase reaction of the Ti film 11 with the GaAs substrate 1, is performed, and thus a solid-phase reaction layer 4 serving as the source/drain is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Figure 4A:
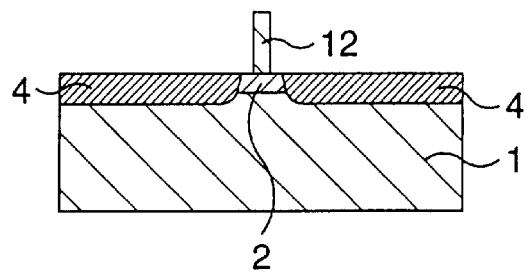
FIGS. 4A to 4D are sectional views showing the manufacturing method of the MESFET according to the first embodiment, in the order of manufacturing steps, which follow FIG. 3D.

Subsequently, by adopting a dry etching method using $SF_6$ gas, the SiN insulating film 14 and the Ti film 11 which did not react are removed as shown in FIG. 4A. At this time, by performing the dry etching under conditions that etching exhibits a comparatively strong isotropy, the WSi film 12 is etched from its lateral direction simultaneously with the etching of the SiN insulating film 14 and the Ti film 11, and the width of the WSi film 12 is shortened. Thus, a gate electrode 3 having a predetermined gate length is formed. Note that this manufacturing step may be performed by means of a wet etching method using hydrofluoric acid or the like.

Figure 4B:
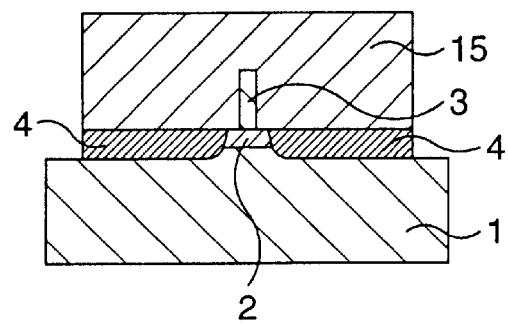

Subsequently, a photoresist 15 is applied and then the photoresist 15 is left only at the element region of the GaAs substrate 1 by means of photolithography, as shown in FIG. 4B. The portions of the solid-phase reaction layer 4 other than the element region are then removed using the photoresist 15 as a mask. The removal of the solid-phase reaction layer 4 is performed by means of a wet etching using, for example, buffer hydrofluoric acid solution.

Figure 4C:
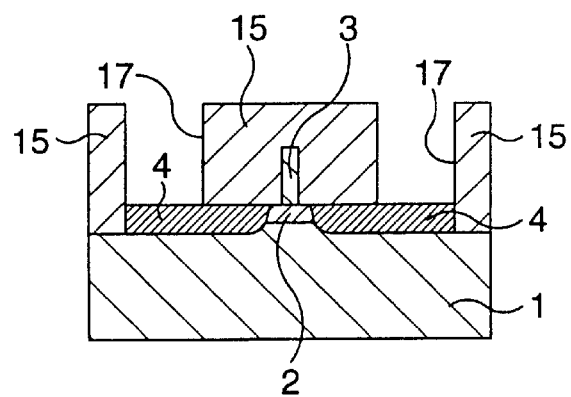

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 4C.

Figure 4D:
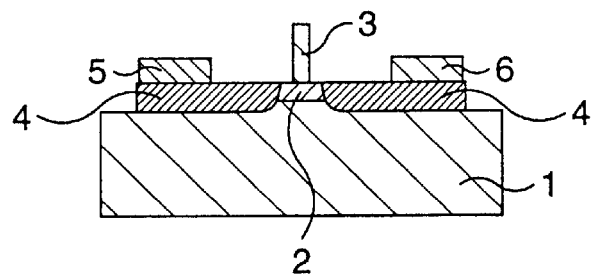

Thereafter, as shown in FIG. 4D, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6),: which are electrically connected to the solid-phase reaction layers 4 serving as the source/drain. It is preferable that a metal such as Ni, Ti, WSi and TiWN is used so as to obtain the ohmic contact (the same can apply to all the embodiments described later).

Alternatively, Au (film thickness: about 150 nm) or Al (film thickness: about 150 nm) is deposited as the ohmic electrode material, and a lift-off is performed for this metal. The ohmic contact may be then obtained by a non-alloy method.

As described above, in this embodiment of the MESFET, the formation of the conductive layer serving as the source/drain is performed by allowing GaAs and Ti to solid-react with each other instead of the ion-implantation method. In this case, because a temperature lower than that of the annealing treatment after the ion-implantation suffices for the thermal treatment for the solid-phase reaction, excessive thermal diffusion of carriers within the solid-phase reaction layer 4 is suppressed, and an extremely shallow junction can be formed. This junction depth is controlled with a high precision by adjusting the thickness of the Ti film 11, and the source/drain can be formed to a desired junction depth with a high precision in accordance with shortening the gate length. Accordingly, the occurrence of a short channel effect is suppressed, and hence a transistor showing excellent device characteristics can be realized.

(Second Embodiment)

In descriptions of this embodiment, exemplified is a HEMT that is a semiconductor device adopting a hetero-junction structure, which is epitaxially grown on a GaAs substrate as a base substrate. In describing this embodiment, constituent components exhibiting functions essentially identical to those used in the MESFET of the first embodiment will be denoted using the same reference numerals, and descriptions for them are omitted.

FIGS. 5A to 5D and FIGS. 6A to 6D are sectional views of a principal portion of a HEMT according to the second embodiment of the present invention, in the order of its manufacturing steps.

Figure 5A:
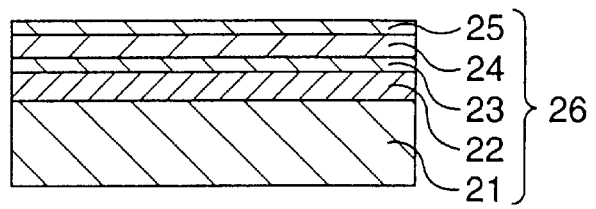
FIGS. 5A to 5D are sectional views showing a manufacturing method of a HEMT, in the order of manufacturing steps, according to the second embodiment of the present invention.

First, as shown in FIG. 5A, a hetero-junction structure substrate 26 is used, which is formed in the following manner. By adopting, for example, a MOCVD method, an i-GaAs buffer layer 22 having a thickness of about 200 nm, an i-InGaAs channel layer 23 having a thickness of about 15 nm and an n-AlGaAs electron supply layer 24 having a thickness of about 25 nm, and an n-type impurity concentration of $2 \times 10^{18}$ /cm$^3$, and an i-GaAs cap layer 25 having a thickness of about 10 nm, are sequentially formed on a semi-insulating GaAs substrate 21.

Figure 5B:
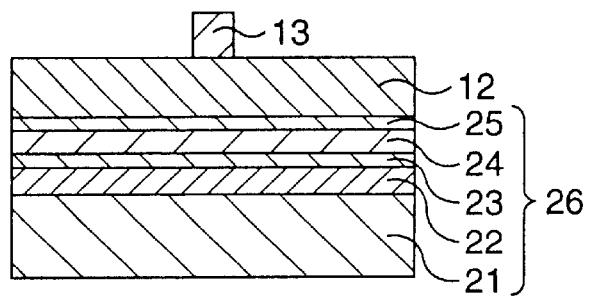

Subsequently, on the i-GaAs cap layer 25, deposited is a WSi film 12 having a thickness of about 400 nm by a sputtering method using WSi as a gate electrode material, as shown in FIG. 5B. A photoresist 13 is then applied on the WSi film 12, and the photoresist 13 is left by photolithography at a portion where a gate electrode is to be formed.

Figure 5C:
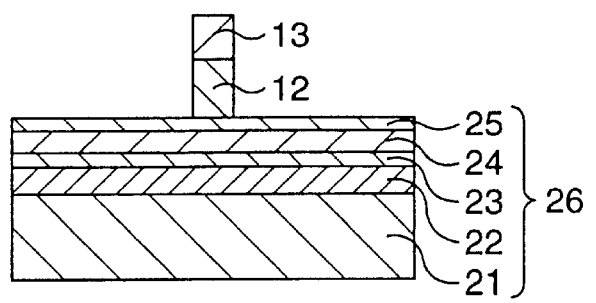

Next, by adopting a dry etching method using $SF_6$ gas, portions of the WSi film 12 other than a portion where a gate electrode is to be formed are removed using the photoresist 13 as a mask, as shown in FIG. 5C.

Figure 5D:
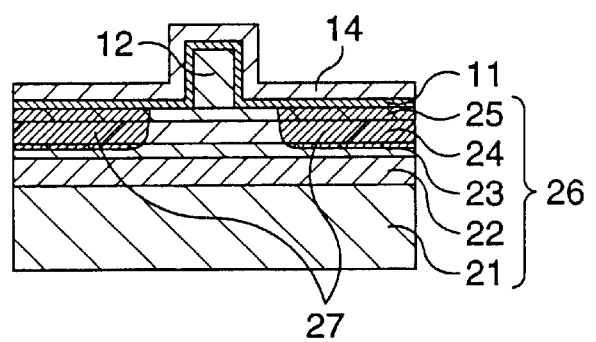

Subsequently, after the photoresist 13 which was used as the mask is removed by an ashing treatment and the like, a Ti film 14i having a thickness of about 10 nm is deposited using Ti as a metal material used for a solid-phase reaction, so as to cover the WSi film 12 and the i-GaAs cap layer 25, shown in FIG. 5D. As a cap layer used for the solid-phase reaction which requires a thermal treatment, for example, a SiN insulating film 14 is then deposited to a thickness of about 20 nm on the Ti film 11 by means of a plasma CVD method. A nitride film is mainly employed as the cap layer. Thereafter, the thermal treatment bringing about the solid-phase reaction of the Ti film 11 with the hetero-junction structure substrate 26 is performed, and thus a solid-phase reaction layer 27 serving as the source/drain is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Figure 6A:
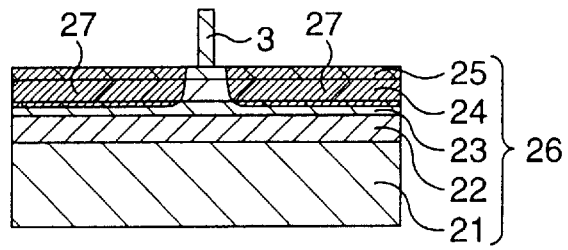
FIGS. 6A to 6D are sectional views showing the manufacturing method of the HEMT according to the second embodiment, in the order of manufacturing steps, which follow FIG. 5D.

Subsequently, by adopting a dry etching method using $SF_6$ gas, the SiN insulating film 14 and the Ti film 11 which did not react are removed as shown in FIG. 6A. At this time, by performing the dry etching under conditions that etching exhibits a comparatively strong isotropy, the WSi film 12 is etched from its lateral direction simultaneously with the etching of the SiN insulating film 14 and the Ti film 11, and the width of the WSi film 12 is shortened. Thus, a gate electrode 3 having a predetermined gate length is formed. Note that this manufacturing step may be performed using a wet etching method using hydrofluoric acid or the like.

Figure 6B:
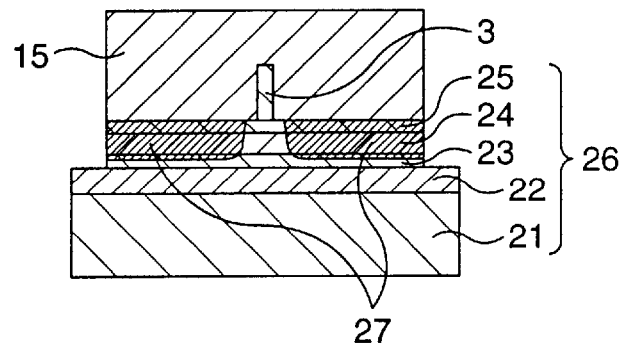

Subsequently, a photoresist 15 is applied and then the photoresist 15 is left only at the element region of the hetero-junction structure substrate 26 by means of photolithography, as shown in FIG. 6B. The i-InGaAs channel layer 23, the n-AlGaAs electron supply layer 24 and the i-GaAs cap layer 25 other than the element region are then removed using the photoresist 15 as a mask. In this case, the removing step is performed using a wet etching by a mixed solution containing hydrofluoric acid solution, hydrogen peroxide solution and water.

Figure 6C:
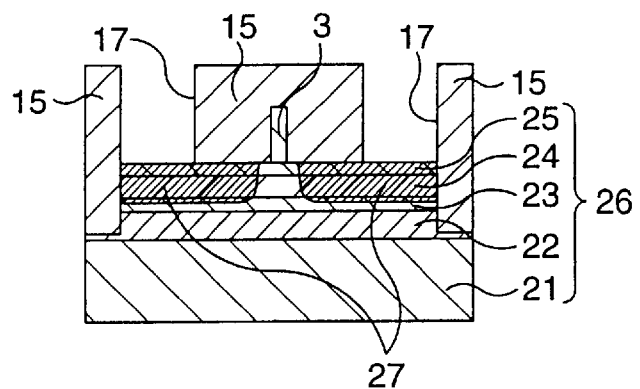

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 6C.

Figure 6D:
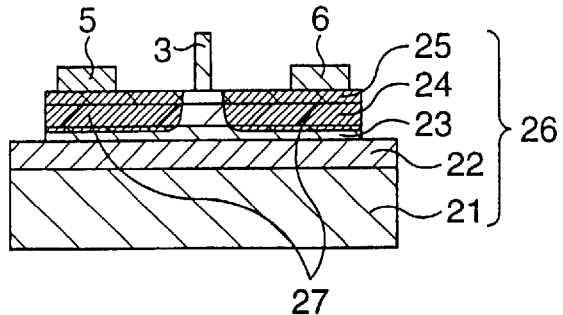

Thereafter, as shown in FIG. 6D, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6), which are electrically connected to the solid-phase reaction layers 27 serving as the source/drain.

Alternatively, Au (film thickness: about 150 nm) or Al (film thickness: about 150 nm) is deposited as. the ohmic electrode material, and a lift-off is performed for this metal. The ohmic contact may be then obtained by a non-alloy method.

As described above, in this embodiment of the HEMT, the formation of the conductive layer serving as the source/drain is performed by allowing GaAs and Ti to solid-react with each other instead of the ion-implantation method. In this case, since a temperature lower than that of the annealing treatment after the ion-implantation suffices for the thermal treatment for the solid-phase reaction, excessive thermal diffusion of carriers within the solid-phase reaction layer 27 is suppressed, and an extremely shallow junction can be formed. This junction depth is controlled with a high precision by adjusting the thickness of the Ti film 11, and the source/drain can be formed to a desired junction depth with a high precision in accordance with shortening the gate length. Accordingly, the occurrence of a short channel effect is suppressed, and hence a transistor showing excellent device characteristics can be realized.

(Third Embodiment)

In descriptions of this embodiment, similarly to the first embodiment, exemplified is a GaAs-base MESFET as a semiconductor device. However, this embodiment is different from the first embodiment in a way to form the channel layer. In describing this embodiment, constituent components exhibiting functions essentially identical to those used in the MESFET of the first embodiment will be denoted using the same reference numerals, and descriptions for them are omitted.

FIGS. 7A to 7D and FIGS. 8A to 8D are sectional views of a principal portion of a MESFET according to the third embodiment of the present invention, in the order of its manufacturing steps.

Figure 7A:
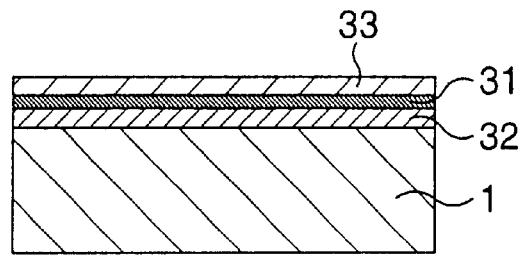
FIGS. 7A to 7D are sectional views showing a manufacturing method of a MESFET, in the order of manufacturing steps, according to the third embodiment of the present invention.

In this embodiment, the channel layer is also formed by a solid-phase reaction of a specific metal and a compound semiconductor. More specifically, a GaAs substrate 1 is prepared as a compound semiconductor substrate, and a Ti film 31 having a thickness of about 7 nm is deposited on the GaAs substrate 1 by a deposition method using Ti as a metal material used for a solid-phase reaction, as shown in FIG. 7A.

Next, as a cap layer used for the solid-phase reaction which requires a thermal treatment, for example, a SiN insulating film 33 film is deposited to a thickness of about 20 nm on the Ti film 31 by means of a plasma CVD method. A nitride film is mainly used as the cap layer. Thereafter, a thermal treatment bringing about the solid-phase reaction of the Ti film 31 with the GaAs substrate 1 is performed, and thus a channel layer 32 is formed on the surface of the GaAs substrate 1. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Figure 7B:
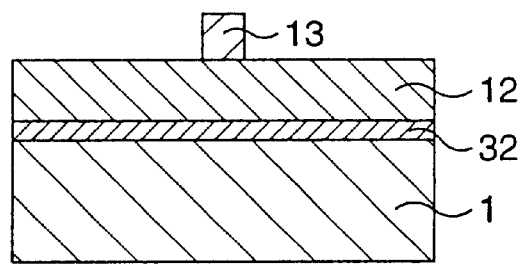

Subsequently, by adopting a dry etching method, the SiN insulating film 33 and the Ti film 31 which did not react are removed. Thereafter, as shown in FIG. 7B, using WSi as a gate electrode material, on the channel layer 32, a WSi film 12 is deposited to a thickness of about 400 nm by a sputtering method. Here, other metals such as Al and TiWN may be used as the gate electrode material instead of WSi. Then, a photoresist 13 is applied on the WSi film 12, and the portion of the photoresist 13 corresponding to a gate electrode formation portion of the WSi film 12 is left by photolithography.

Figure 7C:
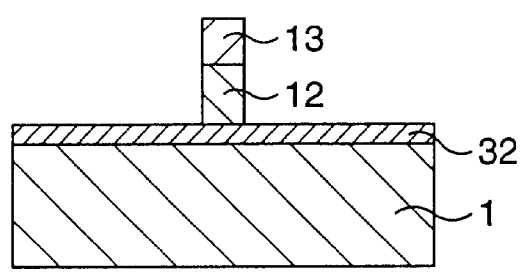

Next, by adopting a dry etching method using $SF_6$ gas, the WSi film 12 other than the gate electrode formation portion is removed using the photoresist 13 as a mask, as shown in FIG. 7C.

Figure 7D:
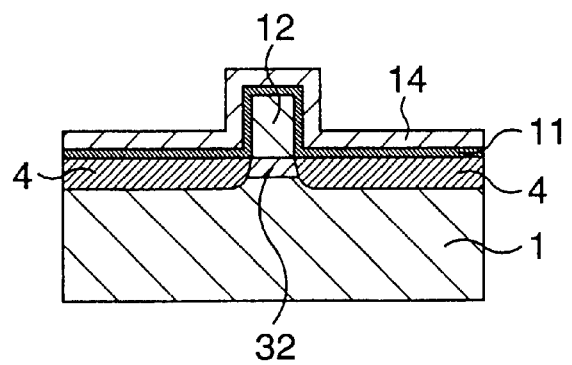

Subsequently, the photoresist 13 that was used as the mask is removed by means of an ashing treatment and the like. Thereafter, as shown in FIG. 7D, using Ti as a metal material used for the solid-phase reaction, a Ti film 11 having a thickness of about 10 nm is deposited on the entire surface of the resultant structure by means of a deposition method. In other words, the Ti film 11 is formed so as to cover the channel layer 32 and the WSi film 12. As a cap layer used for the solid-phase reaction which requires a thermal treatment, for example, a SiN insulating film 14 is then deposited to a thickness of about 20 nm on the Ti film 11 by means of a plasma CVD method. A nitride film is mainly used as the cap layer. Thereafter, a thermal treatment bringing about the solid-phase reaction of the Ti film 11 with the GaAs substrate 1 is performed, and thus a solid-phase reaction layer 4 serving as the source/drain is formed. The thermal treatment is performed, for example, under the conditions that the temperature is 600° C. and the treatment time is 30 seconds. Here, when the thermal treatment is performed at $1.3 \times 10^{-6}$ Torr or less, the cap layer can be omitted.

Figure 8A:
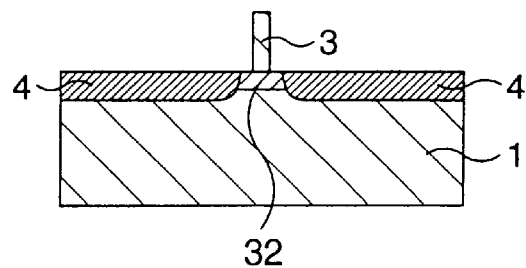
FIGS. 8A to 8D are sectional views showing the manufacturing method of the MESFET according to, the third embodiment, in the order of manufacturing steps, which follow FIG. 7D.

Subsequently, by adopting a dry etching method using $SF_6$ gas, the SiN insulating film 14 and the Ti film 11 which did not react are removed as shown in FIG. 8A. At this time, by performing the dry etching under conditions that etching exhibits a comparatively strong isotropy, the WSi film 12 is etched from its lateral direction simultaneously with the etching of the SiN insulating film 14 and the Ti film 11, and the width of the WSi film 12 is shortened. Thus, a gate electrode 3 having a predetermined gate length is formed. Note that this manufacturing step may be performed using a wet etching method using hydrofluoric acid or the like.

Figure 8B:
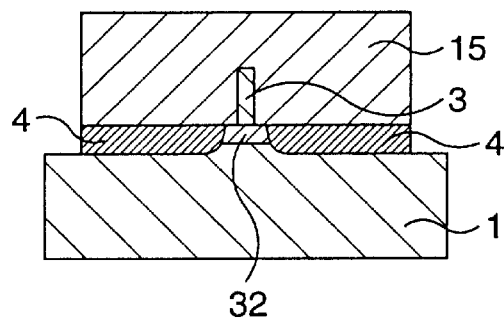

Subsequently, a photoresist 15 is applied and then the photoresist 15 is left only at the element region of the GaAs substrate 1 by means of photolithography, as shown in FIG. 8B. Then, the portions of the solid-phase reaction layer 4 other than the element region are removed using the photoresist 15 as a mask. In this case, the removal of the solid-phase reaction layer 4 is performed by means of a wet etching using, for example, buffer hydrofluoric acid solution.

Figure 8C:
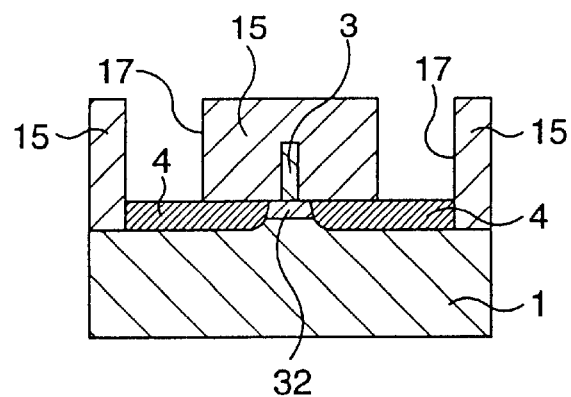

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 8C.

Figure 8D:
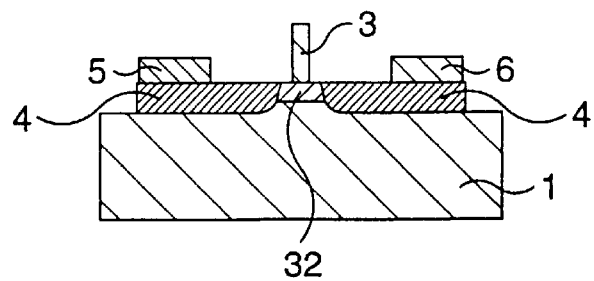

Thereafter, as shown in FIG. 8D, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6), which are electrically connected to the solid-phase reaction layers 4 serving as the source/drain.

Alternatively, Au (film thickness: about 150 nm) or Al (film thickness: about 150 nm) is deposited as the ohmic electrode material, and a lift-off is performed for this metal. The ohmic contact may be then obtained by a non-alloy method.

As described above, in this embodiment of the MESFET, the formation of the channel layer and the formation of the conductive layer serving as the source/drain are performed by allowing GaAs and Ti to solid-react with each other instead of the ion-implantation method. In this case, with reference to the source/drain, since a temperature lower than that of the annealing treatment after the ion-implantation suffices for the thermal treatment for the solid-phase reaction, excessive thermal diffusion of carriers within the solid-phase reaction layer 4 is suppressed, and an extremely shallow junction can be formed. This junction depth is controlled with a high precision by adjusting the thickness of the Ti film 11, and the source/drain can be formed to a desired junction depth with a high precision in accordance with shortening the gate length. Moreover, with reference to the channel layer, since a temperature lower than that of the annealing treatment after the ion-implantation suffices for the thermal treatment for the solid-phase reaction, the thickness of the channel layer can be controlled with a high precision by adjusting the thickness of the Ti film 31. Accordingly, occurrence of a short channel effect is suppressed, and hence a transistor showing excellent device characteristics can be realized.

(Fourth Embodiment)

In descriptions of this embodiment, similarly to the first embodiment, exemplified is a GaAs-base MESFET as a semiconductor device. However, this embodiment is different from the first embodiment in the structure of source/drain. In describing this embodiment, constituent components exhibiting functions essentially identical to those used in the MESFET of the first embodiment will be denoted using the same reference numerals, and descriptions for them are omitted.

FIGS. 9A to 9E and FIGS. 10A to 10E are sectional views of a principal portion of a MESFET according to the fourth embodiment of the present invention, in the order of its manufacturing steps.

Figure 9A:
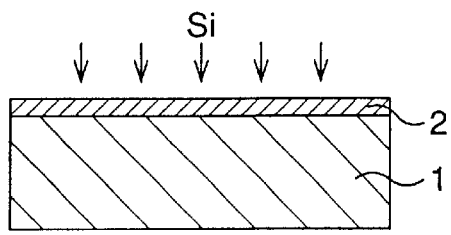
FIGS. 9A to 9E are sectional views showing a manufacturing method of a MESFET, in the order of manufacturing steps, according to the fourth embodiment of the present invention.

As shown in FIG. 9A, a GaAs substrate 1 is prepared as a compound substrate, and Si ions are ion-implanted into the GaAs substrate 1 by means of an ion-implantation method. The ion-implantation is conducted under the conditions that the acceleration energy is 40 keV and the dose is $4 \times 10^{12}$/cm$^2$. Thereafter, a channel layer (n-layer) 2 is formed on the GaAs substrate 1 by performing an activation annealing treatment at a temperature within the range of 700 to 850° C.

Figure 9B:
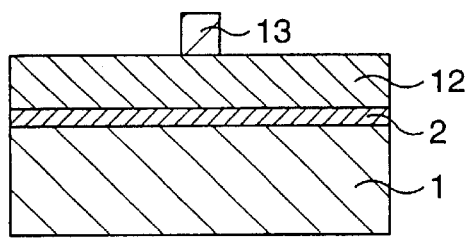

Subsequently, using WSi as a gate electrode material, a WSi film 12 is deposited to a thickness of about 400 nm on the channel layer 2 by means of a sputtering method, as shown in FIG. 9B. A photoresist 13 is then applied on the WSi film 12, and is left at the portion where a gate electrode is to be formed, by photolithography.

Figure 9C:
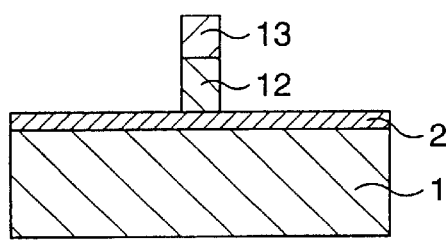

Next, by adopting a dry-etching method using $SF_6$ gas, the portions of the WSi film 12 other than the portion where the gate electrode is to be formed are removed using the photoresist 13 as a mask, as shown in FIG. 9C.

Figure 9D:
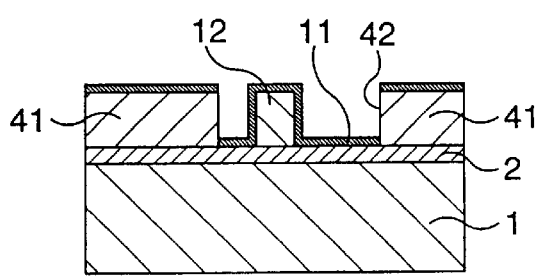

Subsequently, the photoresist 13 that was used as the mask is removed by means of an ashing treatment and the like. Thereafter, as shown in FIG. 9D, a photoresist 41 is applied on the entire surface of the resultant structure, and then processed to a shape having openings 42 at regions including the WSi film 12 and its peripheral portions, by photolithography.

Next, a first metal material for a shallow junction is deposited. More specifically, using Ti as a metal material used for a solid-phase reaction, a Ti film 11 having a thickness of about 10 nm is deposited by a deposition method as a first metal film so as to cover the photoresist 41 and the bottoms of the openings 42. At this time, the WSi film 12 serving as a gate electrode may be off-set. In other words, WSi film 12 may be disposed at a position closer to the source than to the drain, so as to obtain a high drain withstand voltage.

Figure 9E:
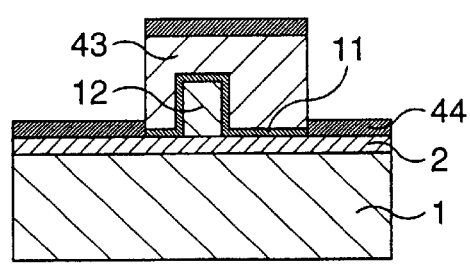

Subsequently, the photoresist 41 which was used as the mask and the Ti film 11 on the photoresist 41 are removed. Thereafter, a photoresist 43 is applied on the entire surface of the resultant structure. The photoresist 43 is then processed by photolithography into a shape to cover the WSi film 12 and its peripheral portions, that is, the photoresist 43 is left only at the region where the Ti film 11 is left as shown in FIG. 9E.

A second metal material for a deep junction is then deposited. More specifically, using Ti as a metal material used for a solid-phase reaction, on the channel layer 2 and the photoresist 43, a Ti film 44 having a thickness of about 15 nm larger than that of the Ti layer 11 is deposited as a second metal film by a deposition method.

Figure 10A:
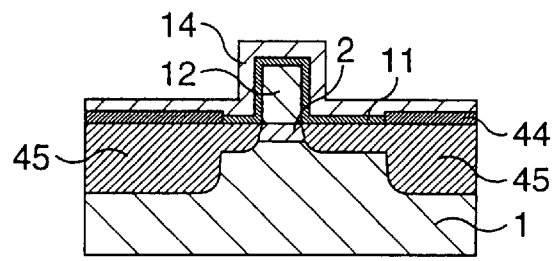
FIGS. 10A to 10E are sectional views showing the manufacturing method of the MESFET according to the fourth embodiment, in the order of manufacturing steps, which follow FIG. 9E.

Subsequently, the photoresist 43 that was used as the mask and the Ti film 44 on the photoresist 43 are removed. At this time, as shown in FIG. 10A, the Ti film 11 exists on the WSi film 12 and the peripheral portions of the WSi film 12, and Ti film 44 exists on the other potions than these portions. The Ti film 11 and the Ti film 44 are in a state where they are connected to each other.

As a cap layer used for the solid-phase reaction which requires a thermal treatment, for example, a SiN insulating film 14 is then deposited to a thickness of about 20 nm on the Ti films 11 and 44 by means of a plasma CVD: method. A nitride film is mainly used as the cap layer. Thereafter, a thermal treatment bringing about the solid-phase reaction of the Ti films 11 and 44 with the GaAs substrate 1 is performed, and thus a solid-phase reaction layer 45 serving as the source/drain is formed. The solid-phase reaction layer 45 is shallow at its portions in the vicinity of the WSi film 12 and deep at the other portions depending on the thickness of the Ti films 11 and 44. In other words, the thickness of the solid-phase reaction layer 45 is small at the portions corresponding to the Ti film 11, and the thickness of the solid-phase reaction layer 45 is large at the portions corresponding to the Ti film 44. The thermal treatment is performed, for example, under conditions that a temperature is 600° C. and a treatment time is 30 seconds. Here, when the thermal treatment is performed in a vacuum state of $1.3 \times 10^{-4}$ Pa or less, the cap layer can be omitted.

Figure 10B:
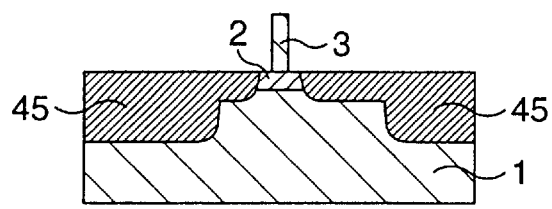

Subsequently, by adopting a dry etching method using $SF_6$ gas, the SiN insulating film 14 and the Ti films 11 and 44 which did not react are removed as shown in FIG. 10B. At this time, by performing the dry etching under conditions that etching exhibits a comparatively strong isotropy, the WSi film 12 is etched from its lateral direction simultaneously with the etching of the SiN insulating film 14 and the Ti films 11 and 44, and the width of the WSi film 12 is shortened. Thus, a gate electrode 3 having a predetermined gate length is formed. Note that this step may be performed using a wet etching method using hydrofluoric acid or the like.

Figure 10C:
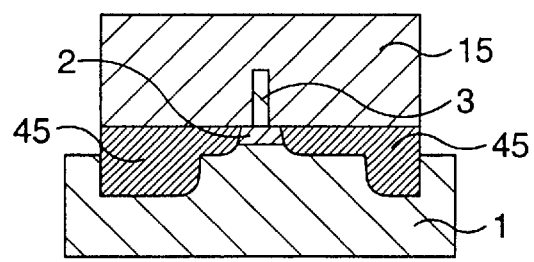

Subsequently, a photoresist 15 is applied and then the photoresist 15 is left on the element region of the GaAs substrate 1 by means of photolithography, as shown in FIG. 10C. The portions of the solid-phase reaction layer 45 other than the element region are then removed using the photoresist 15 as a mask. In this case, the removal of the solid-phase reaction layer 45 is performed by means of a wet etching using, for example, buffer hydrofluoric acid solution.

Figure 10D:
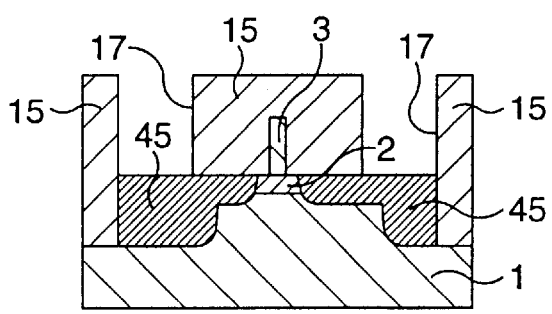

Next, the photoresist 15 which was used as the mask is removed by means of an ashing treatment or the like, and then by adopting photolithography again, a photoresist 16 having openings 17 at portions where ohmic electrodes are to be formed, as shown in FIG. 10D.

Figure 10E:
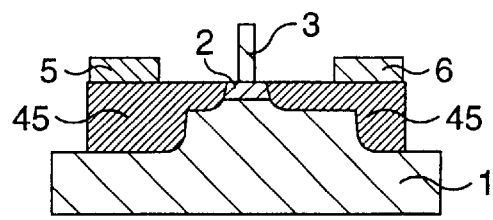

Thereafter, as shown in FIG. 10E, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6), which are electrically connected to the solid-phase reaction layers 45 serving as the source/drain.

Alternatively, Au (film thickness: about 150 nm) or Al (film thickness: about 150 nm) is deposited as the ohmic electrode material, and a lift-off is performed for this metal. The ohmic contact may be then obtained by a non-alloy method.

As described above, in this embodiment of the MESFET, the formation of the conductive layer serving as the source/drain is performed by allowing GaAs and Ti to solid-react with each other instead of the ion-implantation method. In this case, the solid-phase reaction layer 45 is formed into a shape in which it is shallow at its portions in the vicinity of the gate electrode 3 and deep at the other portions. Because a temperature lower than that of the annealing treatment after the ion-implantation suffices for the thermal treatment for the solid-phase reaction, excessive thermal diffusion of carriers within the solid-phase reaction layer 45 is suppressed, and an extremely shallow junction can be formed in the vicinity of the gate electrode 3. This junction depth is controlled with a high precision by adjusting the thickness of the Ti films 11 and 44, and it is possible to form the source/drain so as to have different junction depths with a high precision in response to shortening the gate length. Accordingly, a high withstand voltage of the gate electrode 3 is secured, and the occurrence of a short channel effect is further suppressed. As a result, a transistor showing excellent device characteristics can be realized.

(Fifth Embodiment)

In descriptions of this embodiment, similarly to the second embodiment, exemplified is a HEMT that is a semiconductor device adopting a hetero-junction structure, which is epitaxially grown on a GaAs substrate as a base substrate. This embodiment differs from the second embodiment in a way to regulate a formation position of a solid-phase reaction layer. In describing this embodiment, constituent components exhibiting functions essentially identical to those used in the MESFET of the second embodiment will be denoted using the same reference numerals, and descriptions for them are omitted.

FIGS. 11A to 11E and FIGS. 12A to 12D are sectional views of a principal portion of a HEMT according to the fifth embodiment of the present invention, in the order of its manufacturing steps.

Figure 11A:
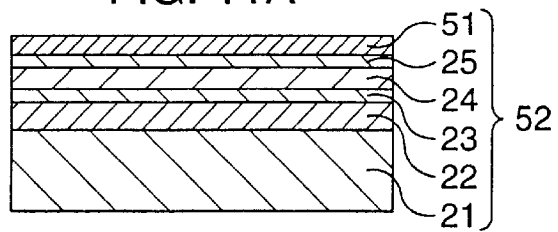
FIGS. 11A to 11E are sectional views showing a manufacturing method of a HEMT, in the order of manufacturing steps, according to the fifth embodiment of the present invention.

First, as shown in FIG. 11A, a hetero-junction structure substrate 52 is used, which is formed in the following manner. By adopting, for example, a MOCVD method, an i-GaAs buffer layer 22 having a thickness of about 200 nm, an i-InGaAs channel layer 23 having a thickness of about 15 nm, an n-AlGaAs electron supply layer 24 having a thickness of about 25 nm and an n-type impurity concentration of $2 \times 10^{18}/cm^3$, an i-GaAs cap layer 25 having a thickness of about 10 nm, and a p-GaAs layer 51 having a thickness of about 20 nm and a p-type impurity concentration of $2 \times 10^{18}/cm^3$ are sequentially formed on a semi-insulating GaAs substrate 21.

Figure 11B:
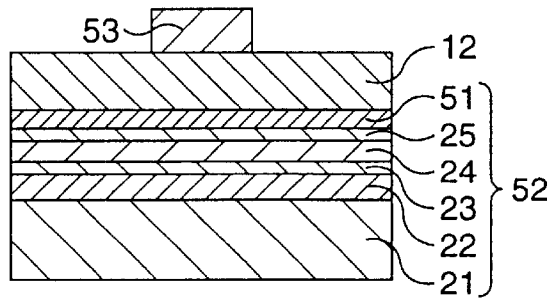

Subsequently, on the p-GaAs layer 51, deposited is a WSi film 12 having a thickness of about 400 nm by a sputtering method using WSi as a gate electrode material, as shown in FIG. 11B. A photoresist 53 is then applied on the WSi film 12, and left by photolithography at a portion where a gate electrode is to be formed. At this time, the photoresist 53 is left so as to have somewhat larger width than a gate electrode formation portion.

Figure 11C:
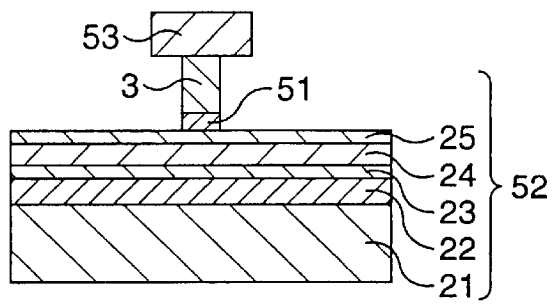

Next, as shown in FIG. 11C, by adopting a dry etching method using $SF_6$ gas, the portions of the WSi film 12 located under the photoresist 53 are removed using the photoresist 53 as a mask. Furthermore, by adopting a dry etching using, for example, chlorine gas, the portions of the p-GaAs layer 51 which are not covered with the WSi film 12 left after the dry etching using the $SF_6$ gas are removed using the photoresist 53 as a mask. The WSi layer 12 and the p-GaAs layer 51 are etched under conditions that they are shortened to a narrower width than the mask length by side etching. Thus, a gate electrode 3 is formed on the p-GaAs layer 51. The p-GaAs layer 51 has the width narrower in comparison with that of the photoresist 53, and the gate electrode 3 has the same width as that of the p-GaAs layer 51.

Figure 11D:
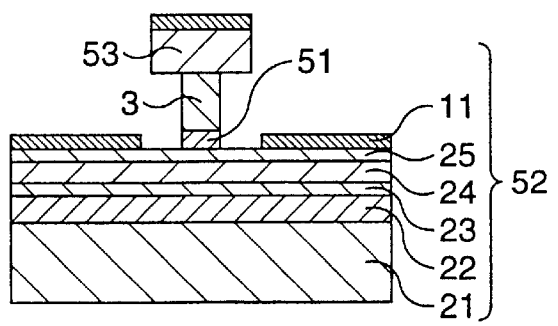

Next, a Ti film 11 having a thickness of about 10 nm is deposited by a deposition method, using Ti as a metal material used for a solid-phase reaction, on the photoresist 53 and the portions of the i-GaAs layer 25 which do not overlap the photoresist 53 vertically. More specifically, the Ti film 11 is formed on the portions of the i-GaAs layer 25 other than the portions thereof in the vicinity of the p-GaAs layer 51 (gate electrode 3), as shown in FIG. 11D.

Figure 11E:
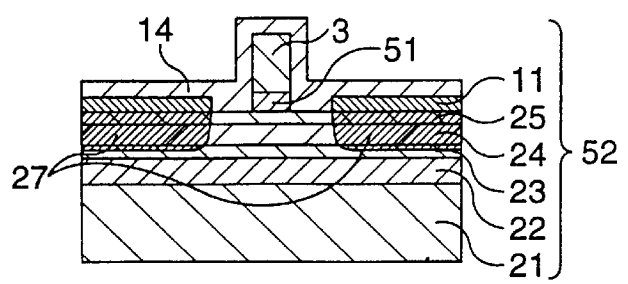

Subsequently, after the photoresist 53 and the Ti film 11 on the photoresist 53 are removed by a lift-off technique, for example, a SiN insulating film 14 is deposited, as a cap layer used for the solid-phase reaction which requires a thermal treatment, to a thickness of about 20 nm on the entire surface of the resultant structure by means of a plasma CVD method, as shown in FIG. 11E. A nitride film is mainly employed as the cap layer. Thereafter, the thermal treatment bringing about the solid-phase reaction of the Ti film 11 with the hetero-junction structure substrate 52 is performed, and thus a solid-phase reaction layer 27 serving as the source/drain is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Because the Ti film 11 was formed at the portions on i-GaAs layer 25, which are separate from both sides of the gate electrode 3, the solid-phase reaction layers 27 are formed at the portions separate from both sides of the gate electrode 3 by the Ti film 11. The formation positions of the Ti film 11 are regulated by the photoresist 53. Thus, a desired channel length can be secured.

Figure 12A:
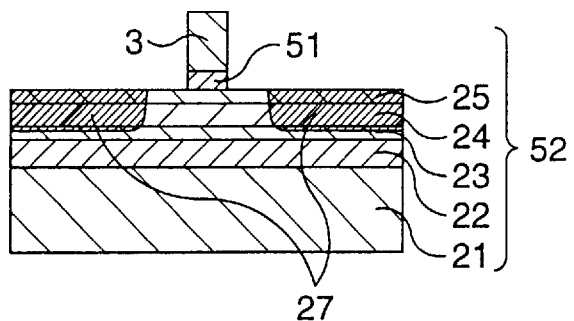
FIGS. 12A to 12D are sectional views showing the manufacturing method of the HEMT according to the fifth embodiment, in the order of manufacturing steps, which follow FIG.11E.

Subsequently, by adopting a dry etching method using $SF_6$ gas, the SiN insulating film 14 and the Ti film 11 which did not react are removed as shown in FIG. 12A. At this time, by performing the dry etching under conditions that etching exhibits a comparatively strong isotropy, the width of the gate electrode 3 may be shortened by etching it from its lateral direction simultaneously with the SiN insulating film 14 and the Ti film 11. Note that this manufacturing step may be performed by means of a wet etching method using hydrofluoric acid or the like.

Figure 12B:
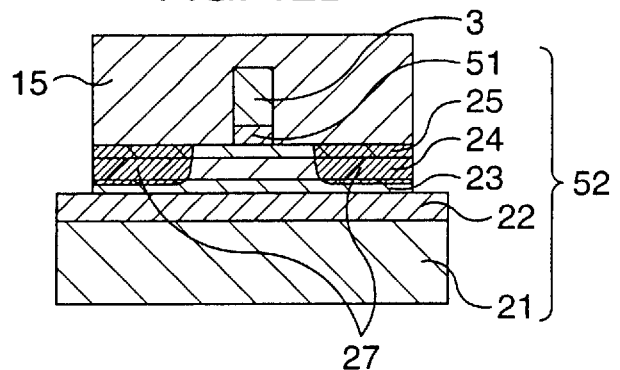

Subsequently, a photoresist 15 is applied, and then the photoresist 15 is left only at the element region of the hetero-junction structure substrate 52 by means of photolithography, as shown in FIG. 12B. The i-InGaAs channel layer 23, the n-AlGaAs electron supply layer 24 and, the i-GaAs cap layer 25 other than the element region are then removed using the photoresist 15 as a mask. In this case, the removing step is performed using a wet etching, for example, by mixed solution containing hydrofluoric acid solution, hydrogen peroxide solution and water.

Figure 12C:
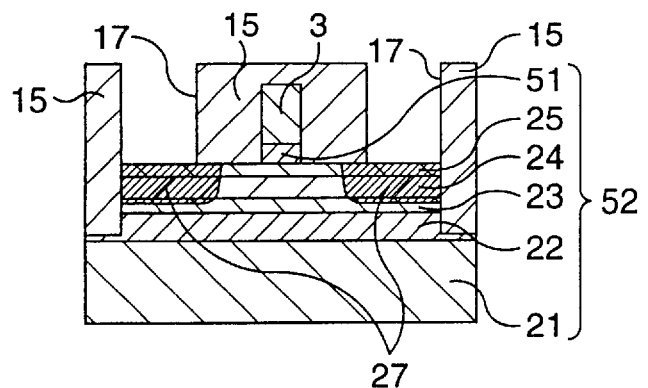

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 12C.

Figure 12D:
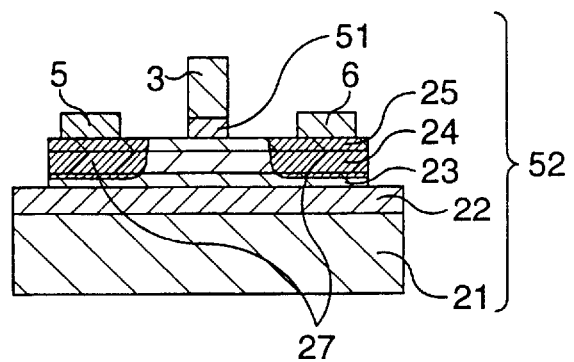

Thereafter, as shown in FIG. 12D, AuGe (film thickness: about 35 nm) /Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6), which are electrically connected to the solid-phase reaction layers 27 serving as the source/drain.

Alternatively, Au (film thickness: about 150 nm) or Al (film thickness: about 150 nm) is deposited as the ohmic electrode material, and a lift-off is performed for this metal. The ohmic contact may be then obtained by a non-alloy method.

As described above, in this embodiment of the HEMT, the formation of the conductive layer serving as the source/drain is performed by allowing GaAs and Ti to solid-react with each other instead of the ion-implantation method. In this case, because a temperature lower than that of the annealing treatment after the ion-implantation suffices for the thermal treatment for the solid-phase reaction, excessive thermal diffusion of carriers within the solid-phase reaction layer 27 is suppressed, and an extremely shallow junction can be formed. This junction depth is controlled with a high precision by adjusting the thickness of the Ti film 11, and the source/drain can be formed to a desired junction depth with a high precision in accordance with shortening the gate length. Accordingly, the occurrence of a short channel effect is suppressed, and hence a transistor showing excellent device characteristics can be realized.

(Sixth Embodiment)

In description of this embodiment, similarly to the first embodiment, exemplified is a GaAs-base MESFET as a semiconductor device. However, this embodiment is different from the first embodiment in a way to regulate formation portions of a solid-phase reaction layer. In describing this embodiment, constituent components exhibiting functions essentially identical to those used in the MESFET of the first embodiment will be denoted using the same reference numerals, and descriptions for them are omitted.

FIGS. 13A to 13E and FIGS. 14A to 14E are sectional views of a principal portion of a MESFET according to the sixth embodiment of the present invention, in the order of its manufacturing steps.

Figure 13A:
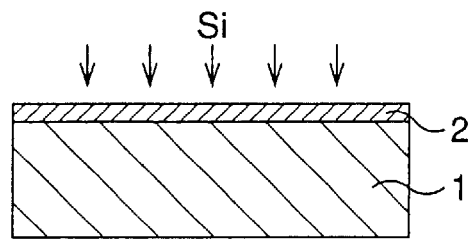
FIGS. 13A to 13E are sectional views showing a manufacturing method of a MESFET, in the. order of manufacturing steps, according to the sixth embodiment of the present invention.

As shown in FIG. 13A, a GaAs substrate 1 is prepared as a compound substrate, and Si ions are ion-implanted into the GaAs substrate 1 by means of an ion-implantation method. The ion-implantation is conducted under the conditions that the acceleration energy is 40 keV and the dose is $4 \times 10^{12}/cm^2$. Thereafter, a channel layer (n-layer) 2 is formed on the GaAs substrate 1 by performing an activation annealing treatment at a temperature within the range of 700 to 850° C.

Figure 13B:
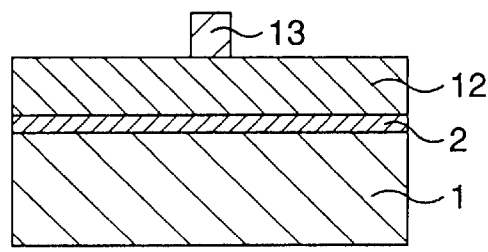

Subsequently, using WSi as a gate electrode material, a WSi film 12 is deposited to a thickness of about 400 nm on the channel layer 2 by means of a sputtering method, as shown in FIG. 13B. A photoresist 13 is then applied on the WSi film 12, and is left at the portion where a gate electrode is to be formed, by photolithography.

Figure 13C:
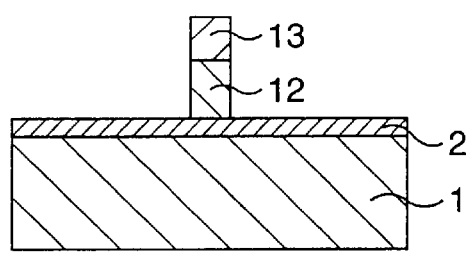

Next, by adopting a dry-etching method using $SF_6$ gas, the portions of the WSi film 12 other than the portion where the gate electrode is to be formed are removed using the photoresist 13 as a mask, as shown in FIG. 13C. Thus, a gate electrode 3 is formed.

Figure 13D:
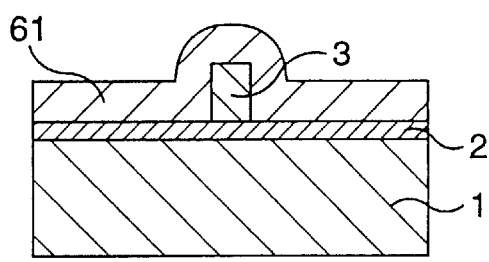

Subsequently, the photoresist 13 that was used as the mask is removed by means of an ashing treatment and the like. Thereafter, as shown in FIG. 13D, a $SiO_2$ film 61 is formed on the entire surface of the resultant structure so as to cover the gate electrode 3, by a plasma CVD method. An SiON film, a SiN film or the like may be formed instead of the $SiO_2$ film 61.

Figure 13E:
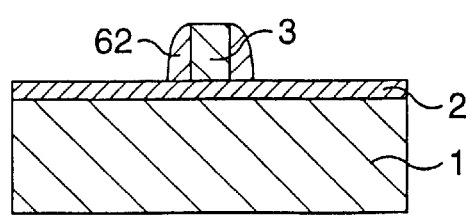

Subsequently, as shown in FIG. 13E, the entire surface of the $SiO_2$ film 61 is subjected to an anisotropic etching, and the $SiO_2$ film 61 is left only at both sides of the gate electrode 3 to form a side wall 62.

Figure 14A:
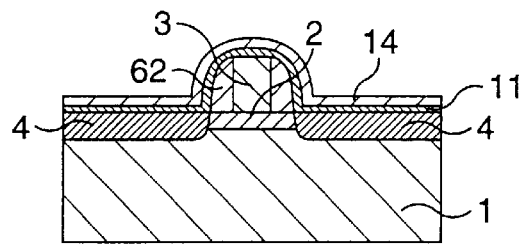
FIGS. 14A to 14E are sectional views showing the manufacturing method of the MESFET according to the sixth embodiment, in the order of manufacturing steps, which follow FIG. 13E.

Next, using Ti as a metal material used for a solid-phase reaction, a Ti film 11 having a thickness of about 10 nm is deposited by a deposition method on the entire surface of the resultant structure, as shown in FIG. 14A. More specifically, the Ti film 11 is formed so as to cover the gate electrode 3, the sidewall 62 and the channel layer 2. Then, as a cap layer used for the solid-phase reaction which requires a thermal treatment, for example, a SiN insulating film 14 is deposited to a thickness of about 20 nm on the Ti film 11 by means of a plasma CVD method. A nitride film is mainly used as the cap layer. Thereafter, a thermal treatment bringing about the solid-phase reaction of the Ti films 11 with the GaAs substrate 1 is performed, and thus a solid-phase reaction layer 4 serving as the source/drain is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Because the Ti film 11 contacts the channel layer 2 at the portions separate from each other by the width of the channel layer 2, in other words, since the Ti film 11 contacts the channel layer 2 at the portions separate from each other by a distance equal to the sum of the width of the gate electrode 3 and the widths of both of the side walls 62, both internal edges of the solid-phase reaction layers 4 are separate from each other by the width of the channel layer 2. More specifically, the solid-phase reaction layer 4 is formed so that the distance between both internal edges of the solid-phase layer 4 is defined by the widths of the side walls 62 and the width of the gate electrode 4. Thus, a desired channel length can be secured.

Figure 14B:
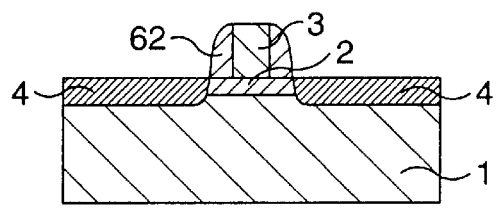

Subsequently, by adopting a dry etching method using $SF_6$ gas, the SiN insulating film 14 and the Ti film 11 which did not react are removed as shown in FIG. 14B.

Figure 14C:
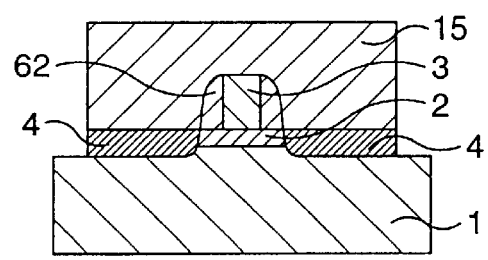

Subsequently, a photoresist 15 is applied and then the photoresist 15 is left on the element region of the GaAs substrate 1 by means of photolithography, as shown in FIG. 14C. The portions of the solid-phase reaction layer 4 other than the element region of the GaAs substrate 1 are then removed using the photoresist 15 as a mask. In this case, the removal of the solid-phase reaction layer 4 is performed by means of a wet etching using, for example, buffer hydrofluoric acid solution.

Figure 14D:
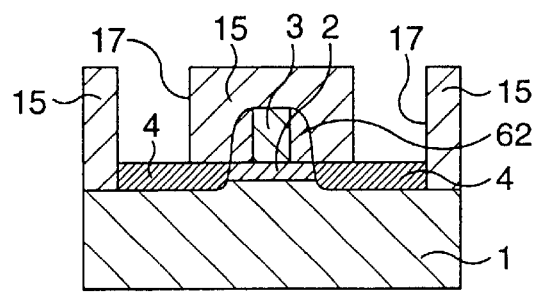

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 14D.

Figure 14E:
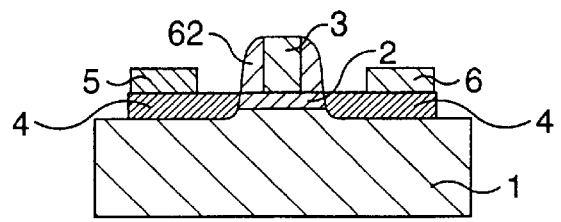

Thereafter, as shown in FIG. 14E, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrodes 5 and 6 (the source and drain electrodes 5 and 6), which are electrically connected to the solid-phase reaction layers 4 serving as the source/drain.

Alternatively, Au (film thickness: about 150 nm) or Al (film thickness: about 150 nm) is deposited as the ohmic electrode material, and a lift-off is performed for this metal. The ohmic contact may be then obtained by a non-alloy method.

As described above, in this embodiment of the MESFET, the formation of the conductive layer serving as the source/drain is performed by allowing GaAs and Ti to solid-react with each other instead of the ion-implantation method. In this case, since a temperature lower than that of the annealing treatment after the ion-implantation suffices for the thermal treatment for the solid-phase reaction, excessive thermal diffusion of carriers within the solid-phase reaction layer 4 is suppressed, and an extremely shallow junction can be formed. This junction depth is controlled with a high precision by adjusting the thickness of the Ti film 11, and it is possible to form the source/drain to a desired junction depth with a high precision in response to shortening of the gate length. Accordingly, the occurrence of a short channel effect is suppressed, and a transistor showing excellent device characteristics can be realized.

(Seventh Embodiment)

In descriptions of this embodiment, similarly to the second embodiment, exemplified is a HEMT that is a semiconductor device adopting a hetero-junction structure, which is epitaxially grown on a GaAs substrate as a base substrate. This embodiment differs from the second embodiment in a formation portion of a solid-phase reaction layer. In describing this embodiment, constituent components exhibiting functions essentially identical to those used in the MESFET of the second embodiment will be denoted using the same reference numerals, and descriptions for them are omitted.

FIGS. 15A to 15E and FIGS. 16A to 16D are sectional views of a principal portion of a HEMT according to the seventh embodiment of the present invention, in the order of its manufacturing steps.

Figure 15A:
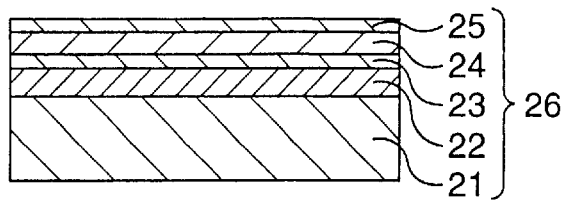
FIGS. 15A to 15E are sectional views showing a manufacturing method of a HEMT, in the order of manufacturing steps, according to the seventh embodiment of the present invention.

First, as shown in FIG. 15A, a hetero-junction structure substrate 26 is used, which is formed in the following manner. By adopting, for example, an MOCVD method, an i-GaAs buffer layer 22 having a thickness of about 200 nm, an i-InGaAs channel layer 23 having a thickness of about 15 nm, an n-AlGaAs electron supply layer 24 having a thickness of about 25 nm and an n-type impurity concentration of $2 \times 10^{18}/cm^3$, and an i-GaAs cap layer 25 having a thickness of about 10 nm are sequentially formed on a semi-insulating GaAs substrate 21.

Figure 15B:
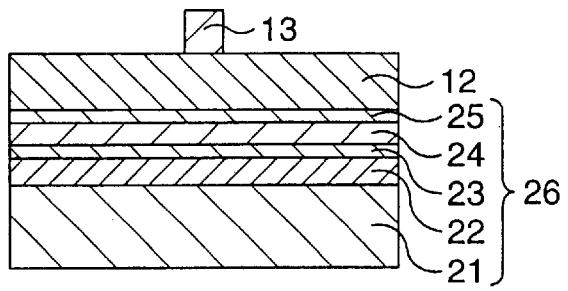

Subsequently, on the i-GaAs cap layer 25, deposited is a WSi film 12 having a thickness of about 400 nm by a sputtering method using WSi as a gate electrode material, as shown in FIG. 15B. A photoresist 13 is then applied on the WSi film 12, and the photoresist 13 is left by photolithography at a portion where a gate electrode is to be formed.

Figure 15C:
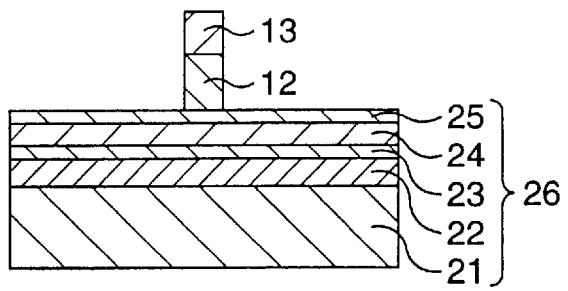

Next, by adopting a dry etching method using $SF_6$ gas, portions of the WSi film 12 other than a portion where a gate electrode is to be formed are removed using the photoresist 13 as a mask, as shown in FIG. 15C.

Figure 15D:
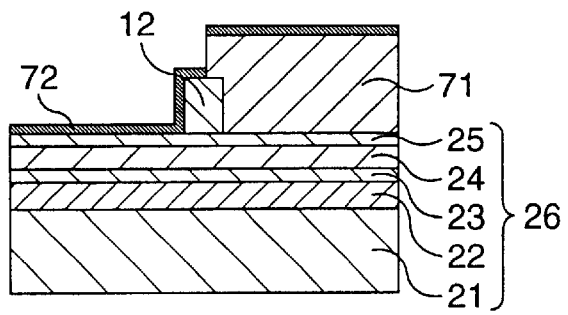

Subsequently, after the photoresist 13 which was used as the mask is removed by an ashing treatment and the like, a photoresist 71 is applied, and the photoresist 71 is processed by photolithography so that the photoresist 71 covers one side of the WSi film 12, as shown in FIG. 15D. In other words, the photoresist 71 is processed so as to extend from one portion of the surface of the WSi film 12 to the drain formation region. A specific metal, in this embodiment, nickel (Ni) film 72 is formed to a thickness of about 10 nm by a deposition method using the photoresist 71 as a mask.

Figure 15E:
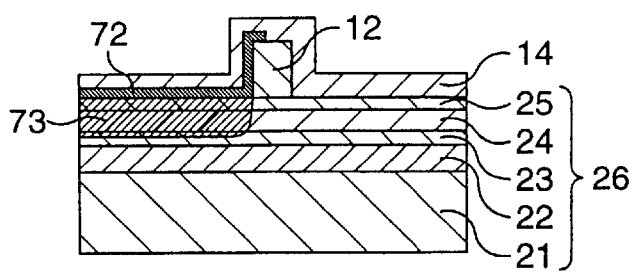

Subsequently, the photoresist 71 which was used as the mask and the Ni film 72 on the photoresist 71 is removed. Thereafter, as a cap layer used for the solid-phase reaction which requires a thermal treatment, for example, a SiN insulating film 14 is deposited to a thickness of about 20 nm by means of a plasma CVD method on the entire surface of the resultant structure, as shown in FIG. 15E. A nitride film is mainly used as the cap layer. Thereafter, the thermal treatment bringing about the solid-phase reaction of the Ni film 72 with the hetero-junction structure substrate 26 is performed, and thus a solid-phase reaction layer 73 serving as the source is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Figure 16A:
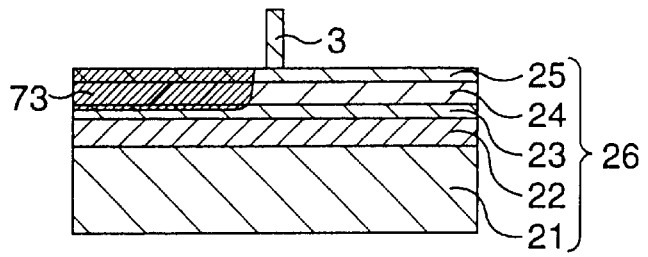
FIGS. 16A to 16D are sectional views showing the manufacturing method of the HEMT according to the seventh embodiment, in the order of manufacturing steps, which follow FIG. 15E.

Subsequently, by adopting a dry etching method using $SF_6$ gas, the SiN insulating film 14 and the Ni film 72 which did not react are removed as shown in FIG. 16A. At this time, by performing the dry etching under conditions that etching exhibits a comparatively strong isotropy, the WSi film 12 is etched from its lateral direction simultaneously with the etching of the SiN insulating film 14 and the Ni film 72, and the width of the WSi film 12 is shortened. Thus, a gate electrode 3 having a predetermined gate length is formed. Note that this step may be performed by means of a wet etching method using nitric acid or the like.

Figure 16B:
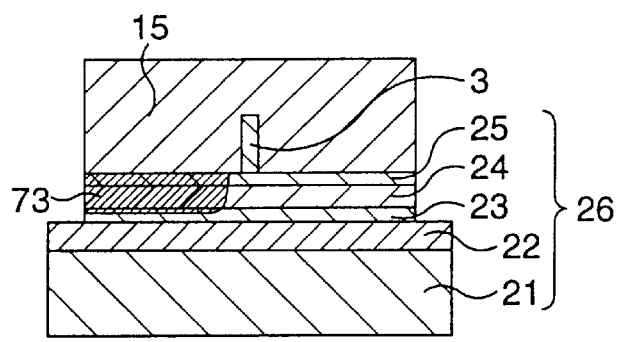

Subsequently, a photoresist 15 is applied and then the photoresist 15 is left only at the element region of the hetero-junction structure substrate 26 by means of photolithography, as shown in FIG. 16B. The i-InGaAs channel layer 23, the n-AlGaAs electron supply layer 24 and the i-InGaAs cap layer 25 other than the element region of the hetero-junction structure are then removed using the photoresist 15 as a mask. In this case, the removing step is performed using a wet etching by mixed solution containing hydrofluoric acid solution, hydrogen peroxide solution and water.

Figure 16C:
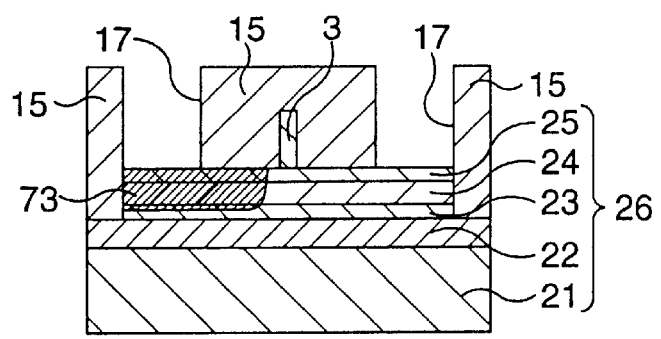

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 16C.

Figure 16D:
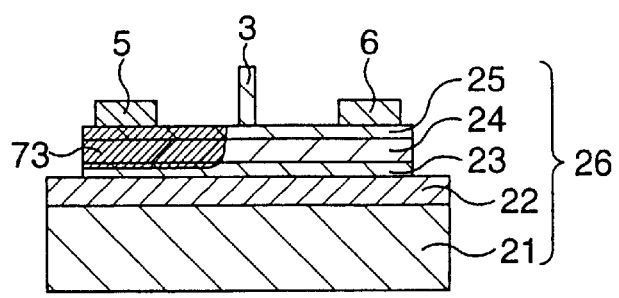

Thereafter, as shown in FIG. 16D, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrode (the source electrode 5) which is connected to the solid-phase reaction layer 73 serving as the source and the ohmic electrode (the drain electrode 6) which is connected to the drain formed by the foregoing alloy method. Here, an n-GaAs layer is formed instead of the i-GaAs cap layer 25, and the drain contact may be secured by use of a tunneling effect without use of the foregoing alloy method.

As described above, in this embodiment of the HEMT, the formation of the conductive layer serving as the source is performed by allowing GaAs and Ni to solid-react with each other instead of the ion-implantation method. In case, since a temperature lower than that of the annealing treatment after the ion-implantation suffices for the thermal treatment for the solid-phase reaction, excessive thermal diffusion of carriers within the solid-phase reaction layer 73 is suppressed, and an extremely shallow junction can be formed. This junction depth is controlled with a high precision by adjusting the thickness of the Ni film 71, and the source can be formed to a desired junction depth with a high precision in accordance with shortening the gate length. Furthermore, the solid-phase reaction layer 73 is formed only at the source region to achieve a low resistance, and hence it is possible to secure a sufficient withstand voltage between the gate and the drain. Accordingly, the occurrence of a short channel effect is suppressed while holding the sufficient gate withstand voltage, and hence a transistor showing excellent device characteristics can be realized.

(Eighth Embodiment)

In descriptions of this embodiment, exemplified is a HEMT that is a semiconductor device adopting a hetero-junction structure, which is epitaxially grown on a GaAs substrate as a base substrate similarly to the second embodiment. This embodiment differs from the second embodiment in the feature that a formation portion of a solid-phase reaction layer is limited. In describing this embodiment, constituent components exhibiting functions essentially identical to those used in the MESFET of the second embodiment will be denoted using the same reference numerals, and descriptions for them are omitted.

FIGS. 17A to 17E and FIGS. 18A to 18D are sectional views of a principal portion of a HEMT according to the eighth embodiment of the present invention, in the order of its manufacturing steps.

Figure 17A:
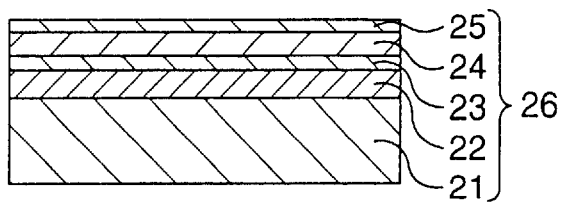
FIGS. 17A to 17E are sectional views showing a manufacturing method of a HEMT, in the order of manufacturing steps, according to the eighth embodiment of the present invention.

First, as shown in FIG. 17A, a hetero-junction structure substrate 26 is used, which is formed in the following manner. By adopting, for example, an MOCVD method, an i-GaAs buffer layer 22 having a thickness of about 200 nm, an i-InGaAs channel layer 23 having a thickness of about 15 nm, an n-AlGaAs electron supply layer 24 having a thickness of about 25 nm and an n-type impurity concentration of $2 \times 10^{18}/cm^3$, and an i-GaAs cap layer 25 having a thickness of about 10 nm are sequentially formed on a semi-insulating GaAs substrate 21.

Figure 17B:
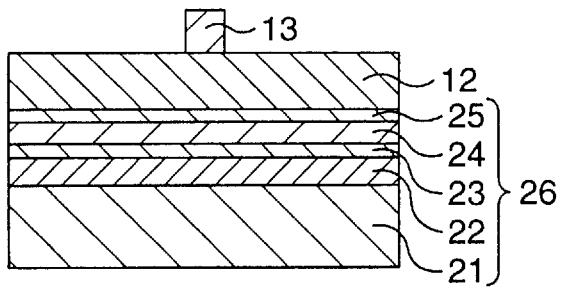

Subsequently, on the i-GaAs cap layer 25, deposited is a WSi film 12 having a thickness of about 400 nm by a sputtering method using WSi as a gate electrode material, as shown in FIG. 17B. A photoresist 13 is then applied on the WSi film 12, and the photoresist 13 is left by photolithography at a portion where a gate electrode is to be formed.

Figure 17C:
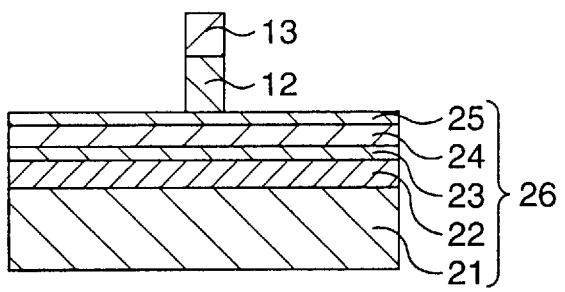

Next, by adopting a dry etching method using $SF_6$ gas, portions of the WSi film 12 other than a portion where a gate electrode is to be formed are removed using the photoresist 13 as a mask, as shown in FIG. 17C.

Figure 17D:
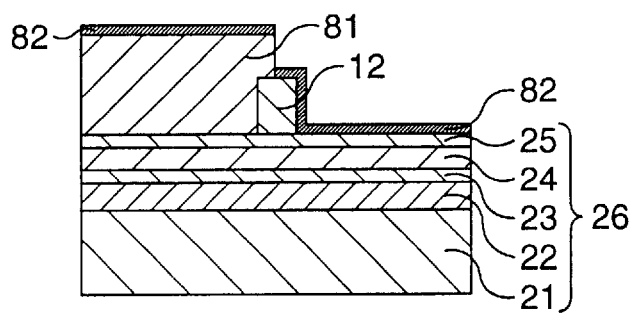

Subsequently, after the photoresist 13 which was used as the mask is removed by an ashing treatment and the like, a photoresist 81 is applied, and the photoresist 81 is processed by photolithography so that the photoresist 81 covers one side of the WSi film 12, as shown in FIG. 17D. In other words, the photoresist 81 is processed so as to extend from one portion of the surface of the WSi film 12 to the source formation region. A specific metal, in this embodiment, a palladium (Pd) film 82 is formed to a thickness of about 7 nm by a deposition method using the photoresist 81 as a mask.

Figure 17E:
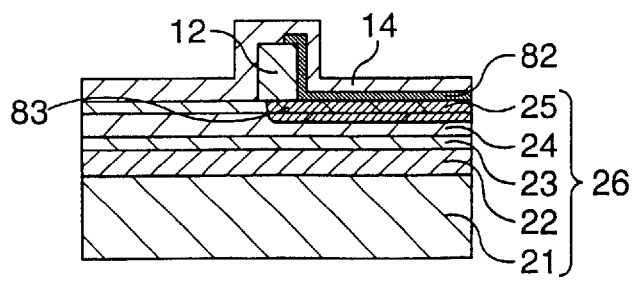

Subsequently, the photoresist 81 which was used as the mask and the Pd film 82 on the photoresist 81 are removed. Thereafter, as a cap layer used for the solid-phase reaction which requires a thermal treatment, for example, a SiN insulating film 14 is deposited to a thickness of about 20 nm on the entire surface of the resultant structure including the Pd film 82, as shown in FIG. 17E. A nitride film is mainly used as the cap layer. Thereafter, the thermal treatment bringing about the solid-phase reaction of the Pd film 82 with the hetero-junction structure substrate 26 is performed, and thus a solid-phase reaction layer 83 serving as the drain is formed. The thermal treatment is performed, for example, under the conditions that the temperature is 600° C. and the treatment time is 30 seconds. Here, when the thermal treatment is performed in a vacuum state of $1.3 \times 10^{-4}$ Pa or less, the cap layer can be omitted.

Figure 18A:
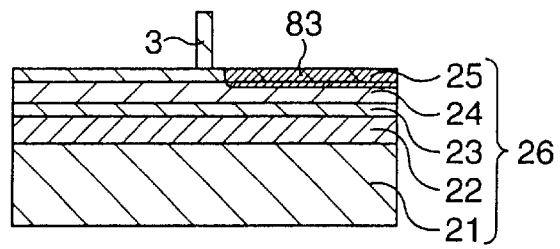
FIGS. 18A to 18D are sectional views. showing the manufacturing method of the HEMT according to the eighth embodiment, in the order of manufacturing steps, which follow FIG. 17E.

Subsequently, by adopting a dry etching method using $SF_6$ gas, the SiN insulating film 14 and the Pd film 82 which did not react are removed as shown in FIG. 18A. At this time, by performing the dry etching under conditions that etching exhibits a comparatively strong isotropy, the WSi film 12 is etched from its lateral direction simultaneously with the etching of the SiN insulating film 14 and the Pd film 82, and the width of the WSi film 12 is shortened. Thus, a gate electrode 3 having a predetermined gate length is formed. Note that this step may be performed by means of a wet etching method using hydrofluoric acid or the like.

Figure 18B:
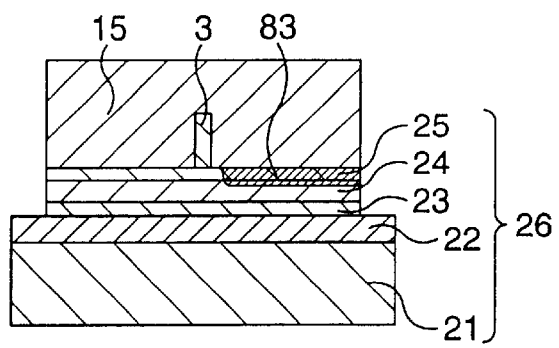

Subsequently, a photoresist 15 is applied and then the photoresist 15 is left only at the element region of the hetero-junction structure substrate 26 by means of photolithography, as shown in FIG. 18B. The i-InGaAs channel layer 23, the n-AlGaAs electron supply layer 24 and the i-GaAs cap layer 25 other than the element region of the hetero-junction structure are then removed using the photoresist 15 as a mask. In this case, the removing step is performed using a wet etching by mixed solution containing hydrofluoric acid solution, hydrogen peroxide solution and water.

Figure 18C:
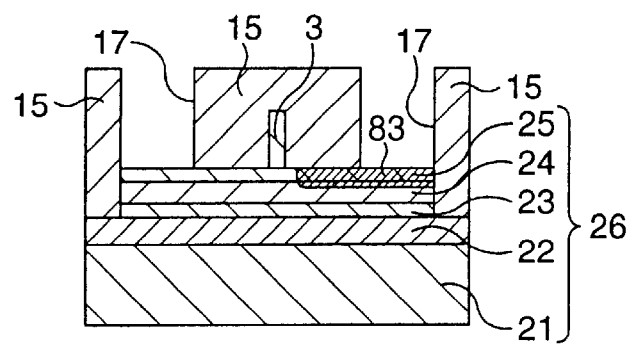

Next, the photoresist 15 which was used as the mask is removed by means of an ashing treatment or the like, and then by adopting photolithography again, a photoresist 16 having openings 17 at portions where ohmic electrodes are to be formed is formed, as shown in FIG. 18C.

Figure 18D:
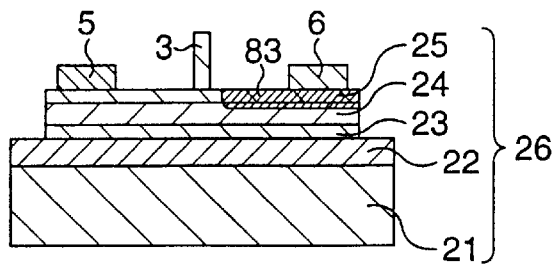
Figure 19:
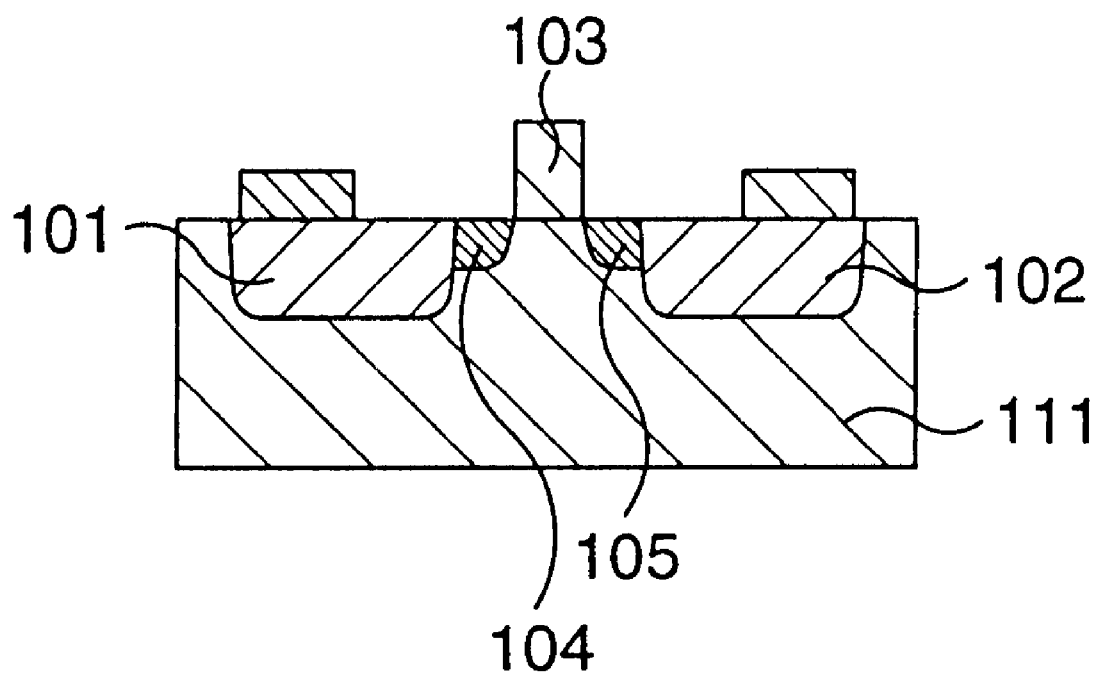
FIG. 19 is a sectional view showing an example of the structure of a conventional MESFET.

Thereafter, as shown in FIG. 18D, AuGe (film thickness: about 35 nm)/Au (film thickness: about 150 nm) is deposited as an ohmic electrode material, and a lift-off is performed for the resultant structure. An ohmic contact is achieved by an alloy method, thus forming the ohmic electrode 6 (drain electrode 6) which is connected to the solid-phase reaction layer 83 serving as the drain and the ohmic electrode 5 (source electrode 5) which is connected to the source formed by the foregoing alloy method. Here, an n-GaAs layer is formed instead of the i-GaAs cap layer 25, and the source contact may be secured by use of a tunnel effect without use of the foregoing alloy method.

As described above, in this embodiment of the HEMT, the formation of the conductive layer serving as the source is performed by allowing GaAs and Pd to solid-react with each other instead of the ion-implantation method. In this case, because a temperature lower than that of the annealing treatment after the ion-implantation suffices for the thermal treatment for the solid-phase reaction, excessive thermal diffusion of carriers within the solid-phase reaction layer 83 is suppressed, and an extremely shallow junction can be formed. This junction depth is controlled with a high precision by adjusting the thickness of the Pd film 82, and the drain can be formed to a desired junction depth with a high precision in accordance with shortening the gate length. Accordingly, occurrence of a short channel effect is suppressed, and hence a transistor showing excellent device characteristics can be realized.

Although the preferred embodiments of the present invention have been described in detail, it should be understood that various changes, substitutions and alternations can be made therein without departing from the spirit and scope of the invention as defined by the appended claims.

What is claimed is:

1. A method of manufacturing a semiconductor device which includes a substrate made of a compound semiconductor, a gate electrode formed on said substrate, and source/drain regions formed in said substrate, said method comprising the steps of:

forming said gate electrode on a channel layer of said substrate;

forming a film of a specific metal onto said substrate so as to cover at least one of side portions of said gate electrode;

reacting said compound semiconductor with said specific metal in solid phase to form at least one solid-phase reaction layer in said substrate; and removing the part of said film which has not been reacted, so that at least one of said source/drain regions is made of said solid-phase reaction layer, wherein said part of said film which has not been reacted is removed by etching, and the gate length of said gate electrode is shortened in the etching process.

2. The method according to claim 1, wherein said film is so formed as to cover the upper and side portions of said gate electrode, so that said solid-phase reaction layer is formed in a self-alignment manner with said gate electrode.

3. The method according to claim 1, wherein said film is so formed as to have its thickness on a periphery of said gate electrode larger than its thickness at a portion near said gate electrode, so that said solid phase reaction layer is formed to be shallow at said portion and deep on said periphery.

4. The method according to claim 1, wherein either side of said gate electrode is covered with an insulating material, and said film is formed.

5. The method according to claim 1, wherein said film is formed such that one side of said gate electrode is covered with a mask, and then said mask is removed, so that said solid-phase reaction layer is formed only on said one side of said gate electrode.

6. The method according to claim 1, wherein said device is manufactured into a MESFET or HEMT structure.

7. The method according to claim 1, wherein said specific metal is one selected among Ti, Co, Ni, Pd and Mo.

* * * * *